(12) United States Patent
Zhang

(10) Patent No.: US 8,697,249 B1
(45) Date of Patent: Apr. 15, 2014

(54) COATED ARTICLE

(71) Applicants: Shenzhen Futaihong Precision Industry Co., Ltd., Shenzhen (CN); FIH (Hong Kong) Limited, Kowloon (CN)

(72) Inventor: Chun-Jie Zhang, Shenzhen (CN)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 0 days.

(21) Appl. No.: 13/864,647

(22) Filed: Apr. 17, 2013

(30) Foreign Application Priority Data

Dec. 29, 2012 (CN) .......................... 2012 1 0588537

(51) Int. Cl.
*B32B 15/04* (2006.01)
*B32B 15/18* (2006.01)
*B32B 15/20* (2006.01)

(52) U.S. Cl.
USPC ........... 428/627; 428/651; 428/666; 428/667; 428/687; 428/628; 428/215; 428/336

(58) Field of Classification Search
USPC ......... 428/651, 666, 667, 685, 687, 627, 628, 428/615, 215, 216, 332, 336, 220
See application file for complete search history.

(56) References Cited

U.S. PATENT DOCUMENTS 3,779,719 A * 12/1973 Clark et al. ................... 428/652

* cited by examiner

*Primary Examiner* — Michael E La Villa
(74) *Attorney, Agent, or Firm* — Novak Druce Connolly Bove + Quigg LLP

(57) ABSTRACT

A coated article includes a substrate and a color layer formed on the substrate. The color layer is a chromium-aluminum-silicon layer containing chromium atoms, aluminum atoms and silicon atoms. The color layer has an L* value between about 25 to about 28, an a* value between about −1 to about −6, and a b* value between about −5 to about −9 in the CIE L*a*b* (CIE LAB) color space. A method for making the coated article is also described.

8 Claims, 2 Drawing Sheets

COATED ARTICLE

BACKGROUND

1. Technical Field

The present disclosure relates to coated articles and a method for making the coated articles.

2. Description of Related Art

Anodic oxidation process and painting process are usually applied to form color layers on the housings of electronic devices. Alternatively, the housings themselves may be made of colored plastic to obtain aesthetic colors. However, these color layers or housings cannot present metallic appearance.

Therefore, there is room for improvement within the art.

BRIEF DESCRIPTION OF THE FIGURE

Many aspects of the coated article and the method for making the coated article can be better understood with reference to the following drawings. The components in the drawings are not necessarily drawn to scale, the emphasis instead being placed upon clearly illustrating the principles of the coated article and the method. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
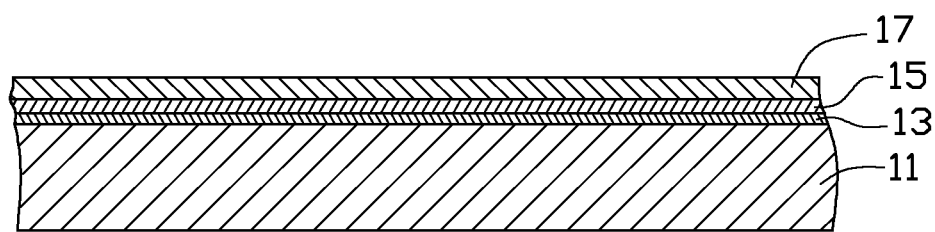
FIG. 1 is a cross-sectional view of an exemplary embodiment of a coated article.

FIG. 1 shows a coated article 10 according to an exemplary embodiment. The coated article 10 includes a substrate 11, a base layer 13 directly formed on the substrate 11, a transition layer 15 directly formed on the base layer 13, and a color layer 17 directly formed on the transition layer 15.

The substrate 11 can be made of stainless steel or aluminum alloy. The base layer 13 is a chromium layer, and has a thickness of about 50 nm to about 100 nm. The transition layer 15 is a nitride chromium layer or a carbide chromium layer, and has a thickness of about 100 nm to about 200 nm.

The color layer 17 is a chromium-aluminum-silicon layer containing chromium atoms, aluminum atoms, and silicon atoms. The number ratio of the chromium atoms, the aluminum atoms and the silicon atoms in the color layer 17 is 1~3:0.5~2:0.3~1. The thickness of the color layer 17 is about 0.3 μm to about 0.5 μm. The color layer 17 has an L* value between about 25 to about 28, an a* value between about −1 to about −6, and a b* value between about −5 to about −9 in the CIE L*a*b* (CIE LAB) color space, so the color layer 17 is blue. The color layer 17 presents a metallic appearance.

Figure 2:
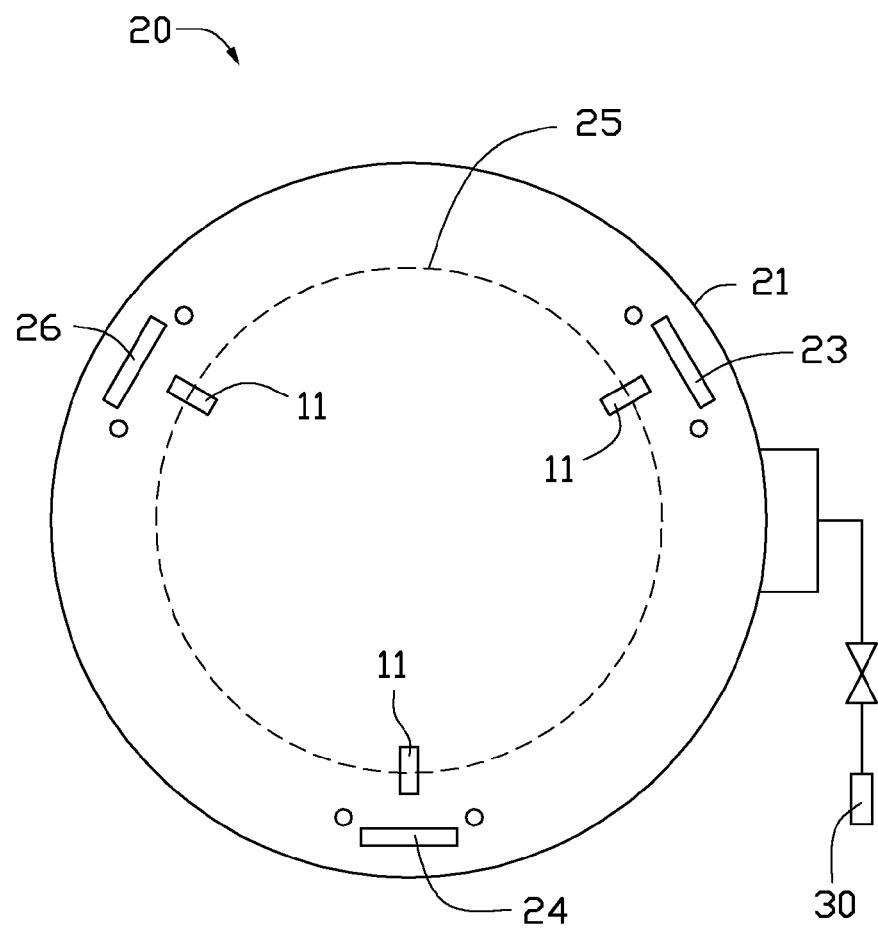
FIG. 2 is a schematic view of a vacuum sputtering device for fabricating the coated article in FIG. 1.

FIG. 2 shows a vacuum sputtering device 20 which includes a vacuum chamber 21 and a vacuum pump 30 connected to the vacuum chamber 21. The vacuum pump 30 evacuates the vacuum chamber 21. The vacuum chamber 21 has a chromium target 23, an aluminum target 24, a silicon target 26, and a rotary rack (not shown) positioned therein. The rotary rack holding the substrate 11 revolves along a circular path 25, and the substrate 11 is also rotated around its own axis while being carried by the rotary rack. Both the chromium target 23 and the aluminum target 24 use radio frequency power supply.

A method for making the coated article 10 may include the following steps:

The substrate 11 made of stainless steel or aluminum alloy is pretreated. The pre-treating process may include wiping the surface of the substrate 11 with alcohol and deionized water respectively, to remove impurities such as grease or dirt from the substrate 11. Then, the substrate 11 is dried.

The base layer 13 is vacuum sputtered on the substrate 11. Vacuum sputtering of the base layer 13 is carried out in the vacuum chamber 21. The substrate 11 is positioned on the rotary rack. The vacuum chamber 21 is evacuated to about $1.0 \times 10^{-3}$ Pa to about $1.0 \times 10^{-2}$ Pa and is heated to a temperature of about 90° C. to about 110° C. Argon gas (Ar) is used as the sputtering gas and is fed into the vacuum chamber 21 at a flow rate of about 100 standard-state cubic centimeter per minute (sccm) to about 200 sccm. The chromium target 23 is supplied with electrical power of about 5 kw to about 8 kw, and the aluminum target 24 is supplied with electrical power of about 0.5 kw to about 1.0 kw. A negative bias voltage of about −200 V to about −350 V is applied to the substrate 11. Deposition of the base layer 13 takes a total of about 10 min to about 15 min.

The transition layer 15 is vacuum sputtered on the base layer 13. Vacuum sputtering of the transition layer 15 is carried out in the vacuum chamber 21. The vacuum chamber 21 is heated to a temperature of about 90° C. to about 105° C. Argon gas is fed into the vacuum chamber 21 at a flow rate of about 120 sccm to about 150 sccm. Acetylene or nitrogen is used as the reaction gas and is fed into the vacuum chamber 21 at a flow rate of about 30 sccm to about 50 sccm. The chromium target 23 is supplied with electrical power of about 4 kw to about 6 kw. A negative bias voltage of about −200 V to about −300 V is applied to the substrate 11. Deposition of the transition layer 15 takes a total of about 30 min to about 50 min.

The color layer 17 is vacuum sputtered on the transition layer 15. Vacuum sputtering of the color layer 17 is carried out in the vacuum chamber 21. The vacuum chamber 21 is heated to a temperature of about 80° C. to about 100° C. Argon gas is fed into the vacuum chamber 21 at a flow rate of about 80 sccm to about 120 sccm. The chromium target 23 is supplied with electrical power of about 3 kw to about 5 kw. The aluminum target 24 is supplied with electrical power of about 2 kw to about 3 kw. The silicon target 26 is supplied with electrical power of about 1 kw to about 2 kw. A negative bias voltage of about −150 V to about −250 V is applied to the substrate 11. Deposition of the transition layer 15 takes a total of about 40 min to about 60 min.

Example 1

The substrate 11 was made of stainless steel 315.

Sputtering to form the base layer 13 on the substrate 11 took place, wherein the vacuum chamber 21 was heated to a temperature of about 100° C. Ar was fed into the vacuum chamber 21 at a flow rate of about 150 sccm. The chromium target 23 was supplied with a power of about 5 kw. A negative bias voltage of about −250 V was applied to the substrate 11. Deposition of the base layer 13 took a total of about 12 min.

Sputtering to form the transition layer 15 on the base layer 13 took place, wherein the vacuum chamber 21 was heated to a temperature of about 100° C. Ar was fed into the vacuum chamber 21 at a flow rate of about 125 sccm. Acetylene was fed into the vacuum chamber 21 at a flow rate of about 45 sccm. The chromium target 23 was supplied with a power of about 5 kw. A negative bias voltage of about −250 V was applied to the substrate 11. Deposition of the transition layer 15 took a total of about 40 min.

Sputtering to form the color layer 17 on the transition layer 15 took place, wherein the vacuum chamber 21 was heated to a temperature of about 85° C. Ar was fed into the vacuum chamber 21 at a flow rate of about 110 sccm. The chromium target 23 was supplied with a power of about 5 kw. The aluminum target 24 was supplied with a power of about 3 kw. The silicon target 26 was supplied with a power of about 1.5 kw. A negative bias voltage of about −200 V was applied to the substrate 11. Deposition of the color layer 17 took a total of about 50 min.

The color layer 17 had an L* value of about 26, an a* value of about −4, and a b* value of about −5 in the CIE L*a*b* (CIE LAB) color space.

Example 2

The substrate 11 was made of aluminum alloy 6061.

Sputtering to form the base layer 13 on the substrate 11 took place, wherein the vacuum chamber 21 was heated to a temperature of about 90° C. Ar was fed into the vacuum chamber 21 at a flow rate of about 120 sccm. The chromium target 23 was supplied with a power of about 5 kw. A negative bias voltage of about −300 V was applied to the substrate 11. Deposition of the base layer 13 took a total of about 12 min.

Sputtering to form the transition layer 15 on the base layer 13 took place, wherein the vacuum chamber 21 was heated to a temperature of about 90° C. Ar was fed into the vacuum chamber 21 at a flow rate of about 120 sccm. Acetylene was fed into the vacuum chamber 21 at a flow rate of about 40 sccm. The chromium target 23 was supplied with a power of about 4 kw. A negative bias voltage of about −270 V was applied to the substrate 11. Deposition of the transition layer 15 took a total of about 35 min.

Sputtering to form the color layer 17 on the transition layer 15 took place, wherein the vacuum chamber 21 was heated to a temperature of about 80° C. Ar was fed into the vacuum chamber 21 at a flow rate of about 105 sccm. The chromium target 23 was supplied with a power of about 3 kw. The aluminum target 24 was supplied with a power of about 2 kw. The silicon target 26 was supplied with a power of about 1 kw. A negative bias voltage of about −250 V was applied to the substrate 11. Deposition of the color layer 17 took a total of about 45 min.

The color layer 17 had an L* value of about 26, an a* value of about −3, and a b* value of about −6 in the CIE L*a*b* (CIE LAB) color space.

Example 3

The substrate 11 was made of stainless steel 314.

Sputtering to form the base layer 13 on the substrate 11 took place, wherein the vacuum chamber 21 was heated to a temperature of about 120° C. Ar was fed into the vacuum chamber 21 at a flow rate of about 135 sccm. The chromium target 23 was supplied with a power of about 6 kw. A negative bias voltage of about −350 V was applied to the substrate 11. Deposition of the base layer 13 took a total of about 15 min.

Sputtering to form the transition layer 15 on the base layer 13 took place, wherein the vacuum chamber 21 was heated to a temperature of about 105° C. Ar was fed into the vacuum chamber 21 at a flow rate of about 130 sccm. Acetylene was fed into the vacuum chamber 21 at a flow rate of about 50 sccm. The chromium target 23 was supplied with a power of about 6 kw. A negative bias voltage of about −250 V was applied to the substrate 11. Deposition of the transition layer 15 took a total of about 35 min.

Sputtering to form the color layer 17 on the transition layer 15 took place, wherein the vacuum chamber 21 was heated to a temperature of about 100° C. Ar was fed into the vacuum chamber 21 at a flow rate of about 120 sccm. The chromium target 23 was supplied with a power of about 5 kw. The aluminum target 24 was supplied with a power of about 3 kw. The silicon target 26 was supplied with a power of about 2 kw. A negative bias voltage of about −230 V was applied to the substrate 11. Deposition of the color layer 17 took a total of about 55 min.

The color layer 17 had an L* value of about 25, an a* value of about −2, and a b* value of about −8 in the CIE L*a*b* (CIE LAB) color space.

The color layer 17 has a blue color and presents a metallic appearance, which provides the coated article 10 an aesthetic appearance.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A coated article, comprising:
   a substrate;
   a transition layer formed on the substrate, the transition layer being a nitride chromium layer or a carbide chromium layer; and
   a color layer directly formed on the transition layer, the color layer being a chromium-aluminum-silicon layer containing chromium atoms, aluminum atoms, and silicon atoms, the color layer having an L* value between about 25 to about 28, an a* value between about −1 to about −6, and a b* value between about −5 to about −9 in the CIE L*a*b* (CIE LAB) color space.

2. The coated article as claimed in claim 1, wherein the number ratio of the chromium atoms, the aluminum atoms and the silicon atoms in the color layer is 1~3:0.5~2:0.3~1.

3. The coated article as claimed in claim 1, wherein the coated article further comprises a base layer directly formed on the substrate, the transition layer is directly formed on the base layer.

4. The coated article as claimed in claim 3, wherein the base layer is a chromium layer.

5. The coated article as claimed in claim 3, wherein the base layer has a thickness of about 50 nm to about 100 nm.

6. The coated article as claimed in claim 1, wherein the transition layer has a thickness of about 100 nm to about 200 nm.

7. The coated article as claimed in claim 1, wherein the substrate is made of stainless steel or aluminum alloy.

8. The coated article as claimed in claim 1, wherein the color layer has a thickness of about 0.3 μm to about 0.5 μm.

* * * * *